United States Patent [19]

Itozaki et al.

[11] Patent Number: 4,988,670
[45] Date of Patent: Jan. 29, 1991

[54] METHOD OF FORMING OXIDE SUPERCONDUCTING FILMS BY IN-SITU ANNEALING

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries, Ltd., Osaka, Japan

[21] Appl. No.: 470,436

[22] Filed: Jan. 24, 1990

Related U.S. Application Data

[63] Continuation of Ser. No. 218,227, Jul. 13, 1988, abandoned.

[30] Foreign Application Priority Data

Jul. 13, 1987 [JP] Japan ................................. 62-174459
Sep. 16, 1987 [JP] Japan ................................. 62-231272

[51] Int. Cl.$^5$ .............................................. B05D 5/12
[52] U.S. Cl. ...................................... 505/1; 505/742; 505/731; 505/732; 427/62; 427/126.3; 427/255.3; 204/192.24
[58] Field of Search .................. 505/1, 742, 730, 731, 505/732; 427/62, 63, 126.3, 255.3; 204/192.24

[56] References Cited

U.S. PATENT DOCUMENTS

3,932,315 1/1986 Sleight ................................ 252/521

FOREIGN PATENT DOCUMENTS

55-12027 2/1980 Japan.
60-173885 9/1985 Japan.

OTHER PUBLICATIONS

Hor et al. "Superconductivity About 90 K in the Square-Planar Compound System $ABa_2Cu_3O_{6+x}$ with A=Y, La, Nd, Sm, Eu, Gd, Ho, Er and Lu" Phys. Rev. Lett. vol. 58(18) May 1987 pp. 1891-1894.
Tonouchi et al. "High Tc Superconductivity of rf-Sputtered Er -Ba-Cu-O Films" Jpn. J. Appl. Phys. vol. 26(9) Sep. 1987 L1462-1464.
Hammond et al "Superconducting Thin Films of the Perovskite Superconductors by Electron-Beam Deposition" Extended Abstracts. MRS. Apr., 1987 pp. 169-171.
Ohkuma et al. "Preparation of Y-Ba-Cu-O Thin Films by Rf-Magnetron Sputtering" Jpn. J. Appl. Phys. vol. 26(9) Sep. 1987 L1484-1486.
Koinuma et al. "Preparation of High-Tc Bi-Si-C a-O Superconducting Thin Films by AC Sputtering" Jpn. J. Appl. Phys. vol. 27(3) Mar. 1988 L376-377.
Morris et al. "The Deposition Fabrication and Characteristics of High Critical Temperature Devices" MRS vol. 99 Nov. 1987 pp. 197-202.
Kamada et al. "Structure and Superconducting Properties of Sputtered G d-Ba-Cu-O Thin Films" Appl. Phys. Lett. 52(20)May, 1988 pp. 1726-1728.
Gavaler et al. "Fabrication of High-Tc Superconducting $YBa_2Cu_3O_7$ Films" Extended Abstract MRS Apr., 1988 pp. 193-196.
Kobin et al. "Superconducting Oxide Thin Films by Ion Beam Sputtering" Adv. Cer. Mat. vol. 2 No. 3B Jul. 1987 pp. 430-435.
Sheng et al. "New 120 K Tl-Ca-Ba-Cu-O Superconductor" Appl. Phys. Lett 52(20) May, 1988 pp. 1738-1740.
Maeda et al. "A New High-Tc Oxide Superconductor Without a Rare Earth Element" Jpn. J. Appl. Phys. 27(2)Feb. 1988 L 209-210.
M. Naito et al.—"Thin-Film Synthesis of the High-$T_c$ Oxide Superconductor $YBA_2Cu_3O_7$ by Electron-Beam Codeposition"-Nov./Dec. 1987.
Magazine Article from Z. Phys. B, Dated Apr., 1986, Titled "Possible High $T_c$ Superconductivity in the Ba-La-Cu-O System" by J. G. Bednorz and K. A. Muller, pp. 189-193.

Primary Examiner—Norman Morgenstern
Assistant Examiner—Roy V. King
Attorney, Agent, or Firm—Kerkam, Stowell, Kondracki & Clarke

[57] ABSTRACT

A process for preparing a superconducting thin film composed of compound oxide such as $YBa_2Cu_3O_{7-\delta}$ deposited on a substrate such as $SrTiO_3$. Improvement is in that a heat-treatment of the deposited thin film is carried out in a same chamber in which the thin film of compound oxide is deposited on the substrate without taking the substrate out of said chamber.

18 Claims, No Drawings

METHOD OF FORMING OXIDE SUPERCONDUCTING FILMS BY IN-SITU ANNEALING

This is a continuation of application Ser. No. 218,227, filed July 13, 1988 now abaondoned.

BACKGROUND OF THE INVENTION

1. Field of the Invention

The present invention relates to an improvement in a method for preparing a superconducting thin film. More particularly, it relates to a method for prearing a superconducting thin film of compound oxide having a high critical temperature and improved uniformity in composition and also possessing lasting stability for a long period.

2. Description of the Related Art

The superconductivity is a phenomenon which is explained to be a phenomenon of a kind of phase change of electrons under which the electrical resistance become zero and the perfect diamagnetism is observed. Thus, under the superconducting condition, electric current of a very high current density can be delivered without any loss of power.

Superconducting devices are well-known in the field of electronics. Typical superconducting device is so called Josephson device in which quantum efficiency is observed macroscopically under the Josephson effect when an electric current is passed through a weak junction arranged between two sauperconducting bodies.

Tunnel junction type Josephson device which is a typical application of the Josephson effect is expected to be a high-speed and low-power consuming switching device owing to smaller energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption.

However, the critical temperature of the conventional superconducting material could not exceed 23.2° K. of $Nb_3Ge$ which was the highest Tc for all studies for the past ten years.

Possibility of existence of a new type of superconducting materials having much higher Tc was revealed by Bednorz and Müller who discovrered a new oxide type superconductor in 1986 [Z. Phys. B64 (1986) 189].

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. Japanese patent laid-open No. 56-109824 discloses a method for preparing a thin film of superconductor represented by $BaPb_{1-x}Bi_xO_3$ (in which $0.05 \leq x \leq 0.35$). In this patent, the thin film is prepared by high-frequency sputtering technique which is carried out in an oxygen containing atmosphere and then the resulting film is further heated at 500° to 550° C. These superconductors, however, possess rather lower transition temperatures of about 10° K. and hence usage of liquidized helium (boiling point of 4.2° K.) as cryogen is indispensable to realize superconductivity.

The new type compound oxide superconductor discovered by Bednorz and Müller is represented by $[La,Sr]_2CuO_4$ which is called as the $K_2NiF_4$-type oxide having a crystal structure which is similar to known perovskite type oxides. The $K_2NiF_4$-type oxides shown such higher Tc as 30° K. which are extremely higher than known superconducting materials.

It was also reported in the news parer that C. W. Chu et al discovered in the United States of America another superconducting material so called YBCO type represented by $YBa_2Cu_3O_{7-x}$ having the critical temperature of in the order of 90° K. in Feb. 1987. Still another type new superconducting material is a compound oxide of Bi-Sr-Ca-Cu-O system and Tl-Ba-Ca-Cu-O system which exhibit such high Tc as more than 100° K. and which are chemically much stable than the abovementioned YBCO type compound oxide or the like.

And hence, possibility of existence of high-temperature superconductors have burst on the scene.

A thin film of superconducting compound oxide may be prepared by sputtering, ion-plating, vacuum deposition, molecular beam epitaxial process or the like. For example, a thin film of the abovementioned YBCO type is prepared by sputtering technique in which a sintered body composed of $YBa_2Cu_3O_{7-x}$ is used as a target. The sputtering conditions for preparing superconducting thin films of compound oxide are disclosed also in our co-pending U.S. patent application Ser. No. 152,714 filed on May 2, 1988.

The abovementioned sputtering technique itself is satisfactory but some of the thin films obtained by such physical vapour deposition technique do not or hardly possess the superconducting property. This fact is explained by defectiveness of oxygen deficiency, in other words, imperfect oxygen contents in the crystal. In fact, the superconductivity or superconducting property of the abovementioned new type superconducting material of compound oxide is influenced by the oxygen contents or oxygen deficiency in the crystalline structure. And hence, if the oxygen deficiency is not proper, neither high-Tc nor reduction of discrepancy between the critical temperature and onset temperature can be realized.

In order to overcome such drawback, it is a usual practice that the deposited thin film prepared by the physical vapour deposition technique is after-treated or annealed in the presence of oxygen gas under heat for example at a temperature ranging from 700° to 1,000° C. This heat-treatment convert the incomplete oxygen deficiency to the proper value that is suitable for realizing high-Tc (critical temperature) and high-Jc (critical current density).

In prior art, the heat-treatment is carried out in a furnace which is equipped specially for this end. In other words, a substrate on which a superconducting thin film is deposited is taken out of a sputtering machine to set the substrate in the furnace. In this operation, however, the substrate having the superconducting thin film thereon is necessarily cooled down and is exposed to surrounding atmosphere and hence desired control of atmosphere can not be assured, so that the resulting products do not possess uniform property and are deteriorated with the passing of time.

Therefore, an object of the present invention is to overcome the abovementioned problems of the conventional technique and to provide a method for prearing a superconducting thin film improved in stability during storage or during use.

SUMMARY OF THE INVENTION

The present invention relates to an improvement in a process for preparing a superconducting thin film composed of compound oxide including the steps comprising depositing a thin film of compound oxide on a substrate and then subjecting the thin film of compound oxide to heat-treatment in the presence of oxygen gas.

According to the first aspect of the present invention, the heat-treatment of the deposited thin film is carried out in a same chamber in which the thin film of compound oxide is deposited on the substrate without taking the substrate out of said chamber.

According to the second aspect of the present invention, the thin film deposited on the substrate is heat-treated at a temperature ranging from 700° to 900° C. and under a partial pressure of oxygen ranging from 0.1 to 5 atm for more than 6 minutes, then is cooled down at a cooling rate of less than 100° C./min, and then is reheated or kept at a temperature ranging from 300° to 500° C. for more than 6 minutes.

The superconducting thin film can be composed of compound oxide of at least one element $\alpha$ selected from IIa group of the Periodic Table, at least one element $\beta$ selected from IIIa group of the Periodic Table and at least one element $\gamma$ selected from a group comprising Ib, IIb, IIIb, IVa and VIIIa group of the Periodic Table. The element $\gamma$ is copper (Cu) in general.

Particularly, the superconducting thin film is preferably a compound oxide represented by the general formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies a range of $0.4 \leq y \leq 3.0$ and $1 \leq z \leq 5$ respectively.

According to a preferred embodiment of the present invention, the element $\alpha$ is Ba or Sr and the element $\beta$ is at least one element selected from a group comprising Y, La, Gd, Dy, Ho, Er, Tm, Yb, Nd, Sm, Eu and Lu. From 10 to 80% of the element $\alpha$ may be substituted by one or more than one of other elements selected from IIa group of the Periodic Table such as Ca or Mg. The element $\beta$ may be a combination of more than two elements selected from IIIa group of the Periodic. A portion of these components can be substituted by at least one of elements selected from a group comprising Al, Fe, Ni, Zn, Ag and Ti.

An atomic ratio of $\alpha$ and $\beta$ depends on the type or system of the compound oxide or on the combination of $\alpha$ and $\beta$. Following atomic ratios are preferably used in case of Ba-Y system, Ba-La system and Sr-La system respectively:

| | |
|---|---|
| Y/(Y + Ba) | 0.06 to 0.94, more preferably 0.1 to 0.4 |
| Ba/(La + Ba) | 0.04 to 0.96, more preferably 0.08 to 0.45 |
| Sr/(La + Sr) | 0.03 to 0.95, more preferably 0.05 to 0.1 |

Thus, the most preferable compound oxides are Y-Ba-Cu-O system, La-Ba-Cu-O system and La-Sr-Cu-O system including the following special systems:

| | | |
|---|---|---|
| $Y_1Ba_2Cu_3O_{7-x}$, | $Ho_1Ba_2Cu_3O_{7-x}$, | $Lu_1Ba_2Cu_3O_{7-x}$, |
| $Sm_1Ba_2Cu_3O_{7-x}$, | $Nd_1Ba_2Cu_3O_{7-x}$, | $Gd_1Ba_2Cu_3O_{7-x}$, |
| $Eu_1Ba_2Cu_3O_{7-x}$, | $Er_1Ba_2Cu_3O_{7-x}$, | $Dy_1Ba_2Cu_3O_{7-x}$, |
| $Tm_1Ba_2Cu_3O_{7-x}$, | $Yb_1Ba_2Cu_3O_{7-x}$, | $La_1Ba_2Cu_3O_{7-x}$, |
| $(La, Sr)_2CuO_{4-x}$ | | | in which x is a number which satisfies a range of $0 < x < 1$.

The abovementioned oxides possess preferably perovskite type or quasi-perovskite type crystal structure. The term of quasi-perovskite type means a structure which can be considered to have such a crystal structure that is similar to perovskite-type oxides and includes an orthorhombically distorted perovskite or a distorted oxygen-deficient perovskite or the like.

The superconducting thin film may be also another type of superconductor consisting mainly of a compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satifies a range of $-2 \leq r \leq +2$. This system is considered to be a single phase of the following compound oxide or a mixed phase consisting mainly thereof:

| | |
|---|---|
| $Bi_4Sr_4Ca_4Cu_6O_{20-r}$, | $Bi_2Sr_2Ca_2Cu_3O_{10-r}$, |
| $Tl_4Ba_4Ca_4Cu_6O_{20-r}$, | $Tl_2Ba_2Ca_2Cu_3O_{10-r}$, | in which r is a number which satisfies a range of $-2 \leq r \leq +2$.

The thin film of superconductor can be prepared by the conventional physical vapour deposition (PVD) technique, such as sputtering, vacuum deposition, ion plating, molecular beam epitaxial growth or the like. It is also possible to use chemical deposition technique (CVD) such as plasma CVD or photo CVD. Generally, the thin film of compound oxide is prepared by sputtering technique.

In case of PVD, a vapour source may be elements of $\alpha$, $\beta$ and $\gamma$ themselves, oxides or carbonates thereof. An atomic ratio of these elements in the vapour source is adjusted in function of evaporation rates of these elements on the basis of an atom ratio of these elements in the thin film to be produced. The vapour source may be a sintered mass or sintered powder which is prepared by sintering a powder mixture of $Y_2O_3$, CuO and $BaCuO_2$ and may have a crystal structure of perovskite or quasi-perovskite type.

The partial pressure of oxygen during the physical vapour deposition is preferably within a range of from $1.0 \times 10^{-8}$ to $5.0 \times 10^{-2}$ Torr and the substrate is preferably heated at a temperature ranging from 100° to 1,000° C. during the physical vapour deposition. When the substrate temperature is not higher than 100° C., a satisfactory thin film can not be obtained because of poor crystallization. To the contrary, when it exceeds 1,000° C., a liquid phase is produced in the thin film and hence the superconductivity is deteriorated.

The substrate may be made of glass, quartz, silicon, sapphire, stainless steel or other ceramics. Particularly, the substrate consists preferably of a single crystal of MgO, $ZrO_2$ or $SrTiO_3$. Desirably, the superconducting thin film is deposited on a {001} plane or {110} plane of a single crystal of MgO or $SrTiO_3$. In fact, the thin film of compound oxide according to the present invention possesses anisotropy in its crystal structure, so that a current passing along the direction which is in parallel with a plane defined by a-axis and b-axis of the crystal show a very high critical current density but the other current passing along the other directions is relatively lower. Therefore, when the x-axis is orientated to a direction which is perpendicular to the plane defined by a-axis and b-axis of the crystal, a current which has much higher critical current density (Jc) can be delivered along a direction which is in parallel with the plane. It is also possible to use {011} plane. The substrate of MgO or $SrTiO_3$ possess such another advantage that no stress is exerted on the thin film deposited during the heat-treatment because their heat-expansion coefficient is very similar to that of the thin film.

The operational condition of sputtering technique for preparing a superconducting thin film is described also in our co-pending U.S. patent application Ser. No. 152,714 filed on May 2, 1988.

According to a preferred aspect of the present invention, the thin film of compound oxide deposited on the substrate is not taken out of a chamber in which the deposition is carried out but is further heat-treated in the same chamber.

In fact, the abovementioned compound oxides possess their transformation point at about 530° C. Effective control or adjustment of oxygen deficiency in the compound oxide can not be realized below the transition point. In other words, if the thin film is cooled below the transition point after the thin film is deposited on a substrate, the crystalline structure of the superconductor change and effective heat-treatment can not be realized or difficult to be performed. The transition point, which will also be referred to as the transformation point herein, refers to the temperature at which the crystal structure changes from tetragonal to orthorhombic, as will be readily appreciated from the discussion above. Thus, in the prior heat-treatment in which the substrate on which the thin film is deposited is taken out of the chamber, the thin film deposited is necessarily cooled down below the transformation point, because the substrate temperature during the physical vapour deposition is about 600° C. Still more, the thin film deposited is exposed to surrounding atmosphere when it is transferred from the chamber to a furnace, so that precise control of cooling rate and atmosphere can not be effected.

According to the present invention, precise control of substrate temperature, cooling rate and atmosphere in the stage of heat-treatment is effected advantageously without cooling the thin film below the transformation point.

According to the second aspect of the present invention, the thin film deposited on the substrate is heat-treated by a special sequence including (i) heating it in oxygen containing atmosphere having a partial pressure of oxygen ranging 0.5 to 5 atm at a temperature ranging from 700° to 900° C. for more than 6 minutes, (ii) cooling it at a cooling rate of less than 100° C./min, and then (iii) reheating or keeping it at a temperature ranging from 300° to 500° C. for more than 6 minutes.

As mentioned above, the superconductivity or superconducting property of new type superconducting material of compound oxide is influenced by the oxygen contents or oxygen deficiency in the crystalline structure and the thin film as deposited does not possess a favorable or proper value of oxygen deficiency and does not exhibit desired superconductivity. The conventional heat-treatment of the thin film which carried out at 700° to 1,000° C. in oxygen containing atmosphere is not satisfactory to produce constantly superconducting thin films which possess uniform property and which are not deteriorated with the passing of time. Such defects are overcome by the present invention.

In the heat-treatment according to the present invention, the partial pressure of oxygen gas is adjusted to a range between 0.5 and 5 atm. If the oxygen partial pressure is not higher than 0.5 atm, no substantial improvement is observed. Higher oxygen partial pressure accelerate the operation but no improvement is obtained above more than 5 atm. Heat-treatment at higher pressure also requires a costly pressure chamber. Therefore, the heat-treatment or annealing is preferably carried out effectively and economically at an oxygen partial pressure of 1 atm.

Under such oxygen partial pressure, the thin film deposited is heated at a temperature ranging from 700° to 900° C. for more than 6 minutes, then cooled down at a cooling rate of less than 100° C./min, and then reheated or kept to a temperature ranging from 300° to 500° C. for more than 6 minutes. After then, the treated thin film is taken out of the chamber. A temperature of about 830° C. in the abovementioned temperature range of 700° to 900° C. is the most preferable one for making oxygen atom penetrate into the thin film. The temperature range of 300° to 500° C. is selected because the abovementioned superconductor has another transformation point at about 400° C.

It is apparent from the description abovementioned that the superconducting thin film of compound oxide according to the present invention have improved stability than conventional superconducting thin film and hence they can be utilized advantageously in a applications of thin film devices, such as Matisoo switching elements or Josephson device, Anacker memory device or Superconducting Quantum Interference Device (SQUID).

Now, the present invention will be described with reference to Examples, but the present invention is not limited thereto.

EXAMPLE 1

A thin film of compound oxide is prepared by magnetron sputtering technique in which a disc of sintered mass of Ba-Y-Cu-O system (4 inch diameter, atomic ratio of Ba:Y:Cu=1.4:0.4:3) is used as a target under the following condition:

| | |
|---|---|
| Substrate: | MgO |
| Substrate temperature: | 800° C. |
| Sputtering gas pressure: | 0.01 to 0.1 Torr |
| composition | $Ar/O_2$ = 50/50 |
| High-frequency power: | 100 to 300 W |
| Sputtering time: | 60 min |
| Thickness of thin film: | 0.2 to 1 μm |

When deposition of a thin film of compound oxide complete, oxygen gas is introduced at ambient pressure into a chamber in which the sputtering is carried out.

Then, the substrate is cooled down slowly at a cooling rate of 2° C./min from 800° to 300° C. and then at a cooling rate of 15° C./min from 300° C. to ambient temperature.

For comparison, a sample which is prepared under the same condition as above is left in the chamber to be cooled down to ambient temperature and then is taken out of the chamber. Then, this sample is reheated in a furnace to 600° C. and cooled down in air.

The result of superconducting properties of a sample according to the present invention and the comparative example is shown in Table 1.

TABLE 1

|  | present invention | comparative example |
|---|---|---|
| Jc (A/cm$^2$, 77K) | $2 \times 10^5$ | $3.2 \times 10^4$ |
| Tc (K) | 88 | 78 |

EXAMPLE 2

Powders of BaCO$_3$ and CuO were mixed and heated to produce an oxide of BaCuO$_2$. Then, the resulting powder was mixed with Y$_2$O$_3$ and CuO in such a proportion that an atomic ratio of Y:Ba:Cu=1:2:3.2 (Cu was added excessively with respect to the stoichiometric value because the sputtering rate of copper is higher than others) and sintered at 950° C. to prepare a sintered block of YBa$_2$Cu$_3$O$_7$.

A thin film was prepared in a sputtering machine on a {001} plane of a substrate of MgO single crystal under following conditions:

| Ar gas introduced: | $5.0 \times 10^{-2}$ Torr |
|---|---|
| O$_2$ gas introduced: | $1.0 \times 10^{-2}$ Torr |
| Substrate temperature: | 650° C. |
| Deposition rate: | about 0.50 Å/sec |
| Thickness of thin film: | 1 μm |

Deposition of the tin film completed, the substrate having the thin film was left in oxygen atmosphere of 1 atm at 830° C. for 0.5 hour and then was cooled slowly at a cooling rate of 10° C./min down to 400° C. After then, the substrate was left at 400° C. for 0.5 hour and then was cooled down in air.

For comparison, a deposited sample which was prepared under the same condition as above was heated at 830° C. for 15 hour and then cooled in air.

Resistance of the resulting thin film was measured on such a sample that has vacuum-deposited aluminum electrodes at opposite sides of the thin film of compound oxide deposited on the substrate.

Measurement of the critical temperature Tco and Tci was carried out by a conventional four probe method in which the sample was immersed in liquidized helium to cool the sample down to a temperature of 8° K. in a cryostat. Then, the temperature dependence of resistance of the sample was determined with rising the temperature gradually to determine a temperature of Tci at which the perfect superconductivity start to be lost and resistance being to appear and a temperature of Tco at which the superconductivity is lost and ordinary resistance begin to appear.

Changes of Tci and Tco are determined by comparing two values observed on same sample just after the thin film is deposited and after one month.

The result are shown in Table 2.

TABLE 2

|  | Just after deposition | | one month after | |
|---|---|---|---|---|
|  | Tco (K) | Tci (K) | Tco (K) | Tci (K) |
| Present invention | 98 | 96 | 98 | 96 |
| Compara. Example | 87 | 78 | 62 | 53 |

What is claimed are:

1. In a process for preparing a compound oxide type superconducting thin film including the steps comprising depositing a thin film of compound oxide on a substrate and then subjecting the thin film of compound oxide to a heat-treatment in the presence of oxygen gas, the improvement characterized in that said heat-treatment is carried out in a same chamber in which the thin film of compound oxide is deposited on the substrate without taking the substrate out of said chamber and in that said heat-treatment is effected before any cooling of the thin film below its transition point by the steps comprising heating the thin film deposited on the substrate at a temperature ranging from 700° to 900° C. for more than 6 minutes, cooling the thin film at a cooling rate of less than 100° C./min, and then keeping the thin film at a temperature ranging from 300° to 500° C. for more than 6 minutes.

2. A process set forth in claim 1, characterized in that said superconducting thin film is prepared by physical vapour deposition technique.

3. A process set forth in claim 1, characterized in that said superconducting thin film is a thin film of compound oxide composed of at least one element α selected from IIa group of the Periodic Table, at least one element β selected from IIIb group of the Periodic Table, copper and oxygen.

4. A process set forth in claim 3, characterized in that said superconducting thin film is a thin film of compound oxide represented by the formula:

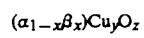

in which α and β means the same definition as above, x is an atomic ratio of β with respect to (α+β) and has a range of $0.1 \leq x \leq 0.9$, and y and z are respective atomic ratios with respect to $(\alpha_{1-x}\beta_x)$ which is considered to be equal to 1 and each satisfies a range of $0.4 \leq y \leq 3.0$ and $1 \leq z \leq 5$ respectively.

5. A process set forth in claim 4, characterized in that said element α is Ba and said element β is at least one element selected from a group comprising Y, La, Gd, Dy, Ho, Er, Tm, Yb, Nd, Sm, Eu and Lu.

6. A process set forth in claim 2, characterized in that a vapour source used in the physical vapour deposition technique in a sintered mass or powder which is prepared by sintering a powder mixture of Y$_2$O$_3$, CuO and BaCuO$_2$.

7. A process set forth in claim 2, characterized in that the partial pressure of oxygen during the physical vapour deposition is within a range of from $1.0 \times 10^{-8}$ to $5.0 \times 10^{-2}$ Torr.

8. A process set forth in claim 2, characterized in that said substrate is heated at a temperature ranging from 100° to 1,000° C. during the physical vapour deposition.

9. A process set forth in claim 2, characterized in that said substrate is a single crystal of MgO or SrTiO$_3$.

10. A process set forth in claim 9, characterized in that said superconducting thin film is deposited on a {001} plane or {110} plane of a single crystal of MgO or SrTiO$_3$.

11. A process set forth in claim 1, characterized in that said superconducting thin film is a thin film of compound oxide represented by the formula:

$$\Theta_4(\Phi_{1-q}Ca_q)_m Cu_n O_{p+r}$$

in which $\Theta$ stands for Bi or Tl, $\Phi$ stands for Sr when $\Theta$ is bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q < 1$, and r is a number which satisfies a range of $-2 \leq r \leq +2$.

12. In a process for preparing a superconducting thin film composed of compound oxide including at least one element $\alpha$ selected from IIa group of the Periodic Table, at least one element $\beta$ selected from IIIb group of the Periodic Table, copper and oxygen, said process including the steps comprising depositing a thin film of compound oxide on a substrate by physical vapour deposition and then subjecting the thin film of compound oxide to a heat-treatment in the presence of oxygen gas, the improvement characterized in that said heat-treatment is carried out in a same chamber in which the thin film of compound oxide is deposited on the substrate without taking the substrate out of said chamber and in that, the film deposited on the substrate is heated at a temperature ranging from 700° to 900° C. and under a partial pressure of oxygen ranging from 0.1 to 5 atm for more than 6 minutes, then is cooled down at a cooling rate of less than 100° C./min, and then is kept at a temperature ranging from 300° to 500° C. for more than 6 minutes.

13. A process set forth in claim 12, characterized in that said superconducting thin film is a thin film of compound oxide represented by the formula:

$$(\alpha_{1-x}\beta_x)Cu_y O_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies a range of $0.4 \leq y \leq 3.0$ and $1 \leq z \leq 5$ respectively.

14. A process set forth in claim 13, characterized in that said element $\alpha$ is Ba and said element $\beta$ is at least one element selected from a group comprising Y, La, Gd, Dy, Ho, Er, Tm, Yb, Nd, Sm, Eu and Lu.

15. A process set forth in claim 12, characterized in that the partial pressure of oxygen during the physical vapour deposition is within a range of from $1.0 \times 10^{-8}$ to $5.0 \times 10^{-2}$ Torr.

16. A process set forth in claim 12, characterized in that said substrate is heated at a temperature ranging from 100° to 1,000° C. during the physical vapour deposition.

17. A process set forth in claim 12, characterized in that said substrate is a single crystal of MgO or SrTiO$_3$.

18. A process set forth in claim 17, characterized in that said superconducting thin film is deposited on a {001} plane or {110} plane of a single crystal of MgO or SrTiO$_3$.

* * * * *

UNITED STATES PATENT AND TRADEMARK OFFICE
CERTIFICATE OF CORRECTION

PATENT NO.   : 4,988,670
DATED        : January 29, 1991
INVENTOR(S)  : ITOZAKI, TANAKA, FUJITA, YAZU, JODAI It is certified that error appears in the above-identified patent and that said Letters Patent is hereby corrected as shown below:

Column 9, line 10, Claim 11 (line 6 of claim), change "bi" to -- Bi --;

Column 9, line 28, Claim 12 (line 14 of claim), after "the" (first occurrence) insert -- thin --.

Signed and Sealed this

Sixteenth Day of June, 1992

Attest:

DOUGLAS B. COMER

*Attesting Officer*        *Acting Commissioner of Patents and Trademarks*